US008558413B1

(12) United States Patent
Lepard

(10) Patent No.: US 8,558,413 B1
(45) Date of Patent: Oct. 15, 2013

(54) LIGHT FIXTURE HAVING POWER OVER ETHERNET POWER SOURCING EQUIPMENT

(75) Inventor: Donald E. Lepard, Chattanooga, TN (US)

(73) Assignee: Global Green Lighting, LLC, Chattanooga, TN (US)

( * ) Notice: Subject to any disclaimer, the term of this patent is extended or adjusted under 35 U.S.C. 154(b) by 0 days.

(21) Appl. No.: 13/544,644

(22) Filed: Jul. 9, 2012

(51) Int. Cl.
*H05K 5/00* (2006.01)

(52) U.S. Cl.
USPC .............................. 307/150; 307/52; 307/157

(58) Field of Classification Search
USPC .......................................... 307/52, 150, 157
See application file for complete search history.

(56) References Cited

U.S. PATENT DOCUMENTS

| | | | | |
|---|---|---|---|---|
| 6,608,453 | B2* | 8/2003 | Morgan et al. | 315/312 |
| 7,587,289 | B1* | 9/2009 | Sivertsen | 702/91 |
| 7,723,862 | B1* | 5/2010 | Spillman et al. | 307/12 |
| 8,011,794 | B1* | 9/2011 | Sivertsen | 362/85 |
| 8,018,161 | B2 | 9/2011 | Smith, III et al. | |
| 8,397,093 | B2* | 3/2013 | Diab et al. | 713/340 |
| 8,432,142 | B2* | 4/2013 | Vorenkamp et al. | 323/266 |
| 2004/0164619 | A1* | 8/2004 | Parker et al. | 307/80 |
| 2007/0258202 | A1* | 11/2007 | Cooley et al. | 361/683 |
| 2008/0094005 | A1* | 4/2008 | Rabiner et al. | 315/294 |
| 2008/0197790 | A1* | 8/2008 | Mangiaracina et al. | 315/312 |
| 2012/0143383 | A1* | 6/2012 | Cooperrider et al. | 700/295 |
| 2012/0223650 | A1* | 9/2012 | Radermacher | 315/200 R |
| 2013/0064136 | A1* | 3/2013 | Apostolakis | 370/254 |
| 2013/0117581 | A1* | 5/2013 | Katkade et al. | 713/300 |
| 2013/0123999 | A1* | 5/2013 | Pereira | 700/295 |

OTHER PUBLICATIONS

Texas Instruments, Power Over Ethernet (POE) Block Diagram, www.ti.com/solution/power$_{13}$ over_ethernet_poe (unknown publication date).
Veracity Global, Power over Ethernet (PoE) Explained, www.veracityglobal.com/support/articles-and-white-papers/poe-explained-part-1.aspx (unknown publication date).
Veracity Global, Power over Ethernet (PoE) Explained, www.veracityglobal.com/support/articles-and-white-papers/poe-explained-part-2.aspx (unknown publication date).
Veracity UK Ltd., PoE Explained, Version 1.1, Dec. 11, 2008.
Electronics Design, Strategy, News, LED Lighting Makes Maximum Use of PoE, Oct. 1, 2008.
FP Outdoor Lighting Controls, PoE OWL FP-287 Specification Sheet (unknown publication date).
Donald Jackson, Speakers Say Utilities Should Partner With Public Safety for 700 MHZ Broadband, http://urgentcomm.com/networks_and_systems/news/utilities-broadband-partners-20120522/index.html, May 22, 2012.

(Continued)

*Primary Examiner* — Adi Amrany
(74) *Attorney, Agent, or Firm* — Miller & Martin PLLC

(57) ABSTRACT

Power over Ethernet power sourcing device is provided inside a light fixture to enable a communications interface and provide electrical power to devices such as cameras, rain sensors, chemical sensors, wireless data uplink units, and other power over Ethernet powered devices. The power over Ethernet system is especially adapted for use in LED street lights and must be able to operate from a wide AC voltage supply range that is typically found in these types of lights.

30 Claims, 3 Drawing Sheets

(56) References Cited

OTHER PUBLICATIONS

Rebecca Boyle, Snazzy All-in-One "Vancouver Poles" to Replace Ugly Urban Forest of Cell Towers and Cables, http://www.popsci.com/teohnology/article/2012-05/snazzy-all-one-utility-poles-will-replace-ugly-urban-forest-cell-towers-and-cables, May 23, 2012.

Dan Jones, LR Live: Going Big on Small-Cell Backhaul, http://www.lightreading.com/document.asp?doc_id=222300, Jun. 26, 2012.

FP Outdoor Lighting Controls, Featured Products Page, www.fischerpierceolc.com/featured_products.htm, (unknown publication date).

* cited by examiner

LIGHT FIXTURE HAVING POWER OVER ETHERNET POWER SOURCING EQUIPMENT

BACKGROUND OF THE INVENTION

The present invention relates to street lighting in general and the advantages to be gained by exploiting the'ubiquitous availability of street light supports to carry additional useful, powered equipment such as traffic cameras, air quality monitoring devices and telecommunication transceivers. This invention further relates to light fixtures, preferably light fixtures having solid state lighting (preferably a light-emitting diode light unit (LED)) and, more particularly, to a solid state light device or fixture that includes at least one power over Ethernet (POE) power sourcing device that may be used to source power and provide a data connection to one or more powered devices that may be either internally or externally affixed to the light fixture or located proximate to the light fixture.

The light fixture of the present invention is suitable for use in connection with any kind of lighting source, including incandescent bulbs, arc lamps, fluorescent tubes, induction lighting and solid state lighting. The light fixture of the present invention is particularly adapted for use as an outdoor street light fixture. The presently preferred lighting source for use in connection with the present invention is solid state lighting, such as an LED light unit.

The term “solid state” is commonly used to refer to light emitted by solid-state electroluminescence, as opposed to incandescent bulbs or fluorescent tubes. LED Solid-State Lighting (SSL) refers to a type of lighting that uses semiconductor light-emitting diodes, organic light emitting diodes, or polymer light-emitting diodes as the source of illumination.

Light Emitting Diode (“LED”) light units are an increasingly popular form of solid state lighting. LED light units (LED bulbs) offer many advantages over incandescent lighting, including lower energy consumption, longer life and ease of control. As the cost of LED light units are reduced, LED light units are being used in more diverse applications, including indoor and outdoor illumination. Solid-state lighting is often used in traffic lights and is quickly becoming the light engine choice for development in modern vehicle lights, street lights, tunnel lights, parking lot lights, indoor parking garages, area flood lights, building exteriors, bill board signage, and indoor commercial and residential lighting.

A light fixture includes a connection to an external power supply. When the light fixture is a table lamp, the connection is typically provided by a common plug plugged into a electrical wall socket or power strip and the housing of the light fixture has its own base upon which to rest. However, when the light fixture is an outdoor light fixture, such as a street light, mounted upon a utility pole or other elevated support, significant costs are incurred in providing a connection between the external power supply and the light fixture. Typically, a wired connection is made through the inside of the utility pole and into the light fixture through the light fixture mount to a terminal block inside the light fixture. This arrangement keeps the wiring for the light from being exposed to the elements. When the pole is made of wood, however, the wiring is external on the pole side, but enters the light fixture at a weatherproof connector or port in the light fixture housing before connecting to the terminal block.

For street lighting applications, it is desirable to mount additional types of powered devices to the light, mounting arm between the light and pole, utility pole or other lighting structures to provide any one of numerous complimentary services or capabilities. This placement takes advantage of the high vantage point offered by these structures, which are densely scattered throughout populated areas and are common even in relatively unpopulated areas.

It is even more desirable for such powered devices to be adapted in such a manner as to be able to send and receive digital data, thereby enabling remote control of the powered device and for the remote device to transmit data, such as a video feed via a wireless, hard-wired or fiber optic Internet haul connection to a central communication and control computer where the data can be put to further useful purpose. Such additional powered devices include, but are not limited to, control units for the lights, control units for other powered devices, computer networking devices, network switches, network routers, security cameras, traffic cameras, video cameras, still-photography cameras, other surveillance equipment, rain sensors, air quality sensors, chemical sensors, radiation sensors, light sensors, temperature sensors, wind sensors, humidity sensors, air pressure sensors, wireless access points, wireless data uplink units, wireless data receivers, telecommunication transmitters and receivers, two way radios, VOIP telephones, energy consumption meters, heating devices, cooling devices, fans, heat sinks, memory devices, or any other powered device desired and adaptable for attachment to a light fixture, such as a street light.

Until now, the usefulness of attaching such desired powered devices to utility poles has been tempered by the additional costs associated with installing a separate and metered connection for such powered devices to an external power source. Such separate power connections currently require additional wiring installed by a licensed electrician and attachment to the pole. Even for a small city or town, the cost of adding additional power supply hook-ups, with or without meters, to the tops of hundreds of utility poles scattered over hundreds of square miles is prohibitive. Similarly, providing a digital data back haul communication link with such powered devices can be even more expensive.

Additionally, the installation, repair, service, maintenance, upgrading or replacement of such powered devices is an added burden when the powered devices are hard-wired to an external power supply. For example, where the effort has been made to install an air quality sensor atop a utility pole, even upgrading the sensor can be burdensome as it would typically require someone with an electrical and/or telecommunications background to travel to each far-flung device to disconnect the hard-wired power supply and telecommunications link and reconnect the new, upgraded sensor.

There exists a need for an improved means for providing power and digital data communication connections to powered devices atop utility poles.

There also exists a need for simplifying the ability to easily interchange or replace powered devices that are situated atop utility poles. There also exists a need for reducing initial installation costs associated with such powered devices.

There also exists a need for remotely monitoring the status and power usage of powered devices installed in outdoor locations.

BRIEF SUMMARY OF THE INVENTION

The present invention is a light fixture, such as a light fixture suitable for installation atop a utility pole or other elevated vantage point, having at least one power over Ethernet power sourcing device for use in providing a power source to one or more internally or externally affixed powered devices or proximately located powered devices. The power over Ethernet power sourcing device is housed within the light fixture, preferably with a separate power input connection to the terminal block hosting the external input power source of the light fixture, the light unit or units (or the light power supply drivers) having their own separate power input connection to the common input power terminal block. The power over Ethernet power sourcing device is preferably a separate power and data connection source for powered devices distinct from the power source for the light units of the light fixture, the power over Ethernet power sourcing device having its own, independent electrical circuit apart from the circuit or circuits providing electricity to the light units. Preferably, the light fixture houses a solid state or LED light unit.

The power over Ethernet power sourcing device provides one or more, preferably a plurality of ports or peripheral bus receptacles, such as USB ports, RJ45 ports, or multi-pin ports, each of which is adapted to provide power to and data communication to and among a number of powered devices, specifically, a wireless telecommunications device for transmitting data, a network switch, and a microcontroller unit for monitoring and controlling the voltage and current of each peripheral bus receptacle. One or more peripheral powered devices, such as a digital camera, wireless access point, light control unit (such as an LED driver), or other desired sensors may then be easily connected, disconnected and exchanged through use of the peripheral bus receptacles, and each of the powered devices may in turn be remotely controlled or monitored by or transmit data to a central communications and control computer or server, such as a cloud server.

The power over Ethernet power sourcing device is mounted inside the light fixture. Preferably, both the power over Ethernet power sourcing device of a light fixture and the light units of the light fixture are both independently connected to a common input from an external power source. The power over Ethernet power sourcing device is connected to a separate terminal of the terminal block connected to the external power source. The power over Ethernet power sourcing device is able to host powered devices other than the light engine (light control unit or LED driver), providing a separate power supply source apart from the light units for such powered devices. The power over Ethernet power sourcing device also supports data transfer and reception via either a wireless, hard-wired or fiber optic Internet interface. Similarly, it provides support for a separate energy consumption and power on/of status remote monitoring device.

BRIEF DESCRIPTION OF THE DRAWINGS

The particular features and advantages of the invention as well as other objects will become apparent from the following description taken in connection with the accompanying drawings in which.

DETAILED DESCRIPTION OF THE INVENTION

Figure 1:
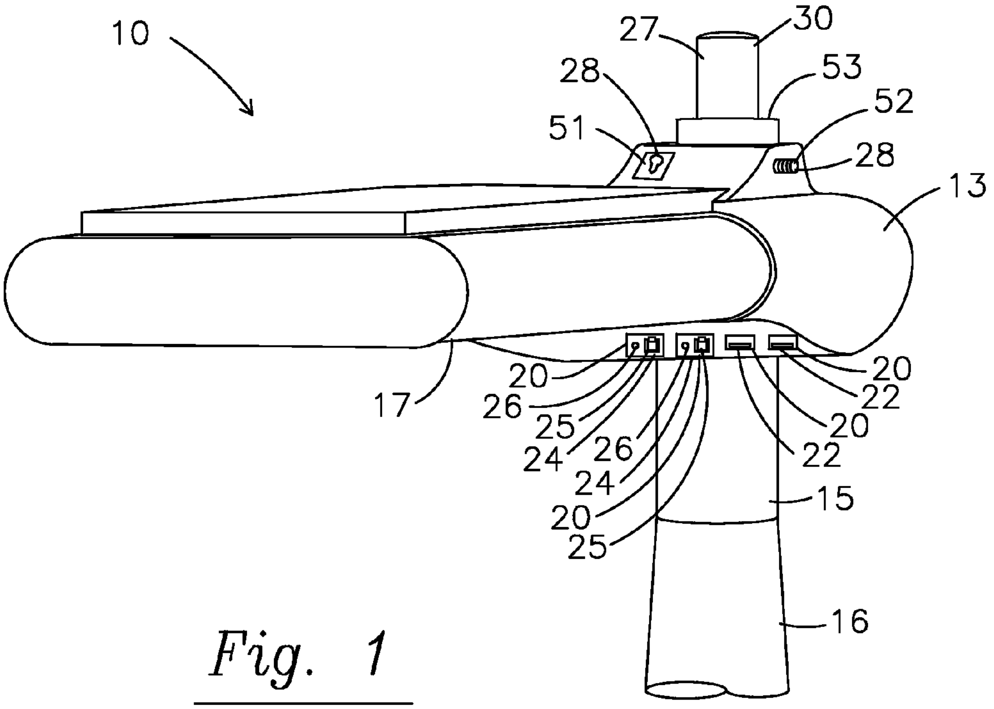
FIG. 1 is a side perspective illustration of a light fixture of an embodiment of the present invention.
Figure 2:
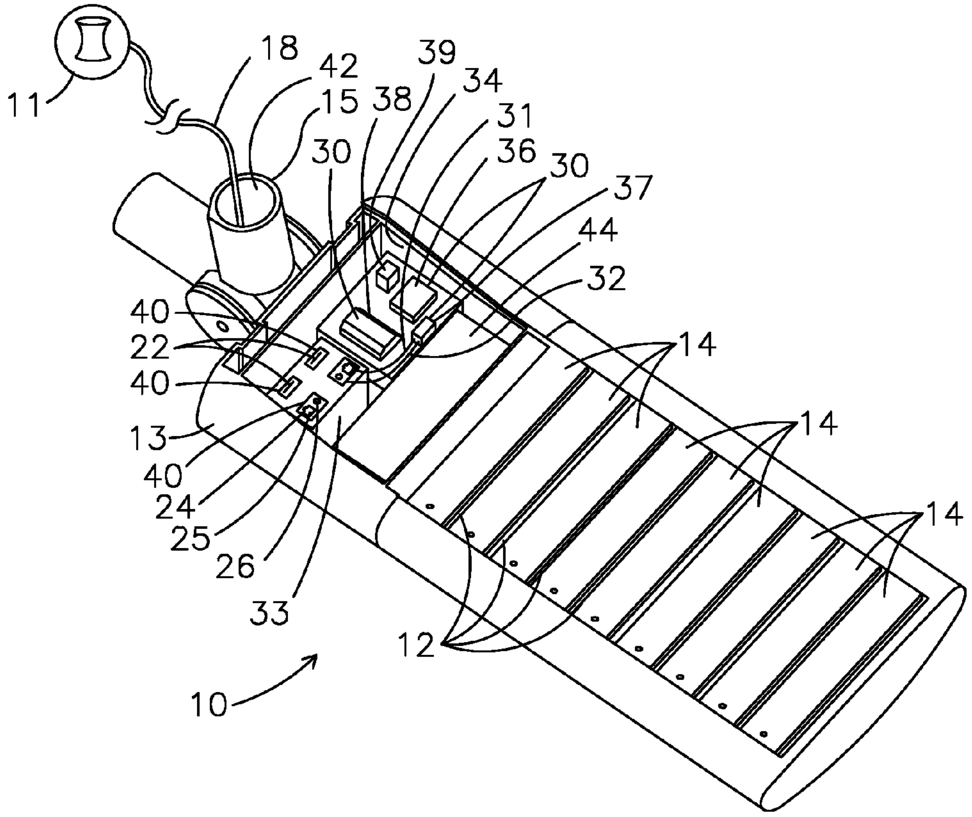
FIG. 2 is a bottom perspective illustration of a light fixture of an embodiment of the present invention with an access panel removed.

A light fixture 10 according to the present invention is illustrated in FIGS. 1 and 2. Light fixture 10 has a weatherproof outer housing or shell, such as die-cast aluminum housing 13 or composite injection molded material, about the internal components (not shown in FIG. 1) of the light fixture 10. The outer housing 13 further comprises one or more globes or optical lenses 14 for allowing light out of the outer housing 13 or, in the alternative, one or more accessible light sockets or receptacles (not shown) for receiving direct attachment of and providing power to one or more light units 12 (See FIG. 2). The light fixture 10 further comprises a mounting means or mounting portion 15 for attaching the light fixture 10 to a utility pole or other support structure 16. The outer housing 13 and globes or optical lenses 14 may be formed from any suitable materials which are well known in the art, as are the various types of mounts 15 or mounting means.

In the embodiment shown in FIG. 1, outer housing 13 further comprises one or more external peripheral bus receptacles 20 supplying both power and data communication to a powered device 30 located outside of the housing 13. External peripheral bus receptacles 20 may be of any known type or kind suitable for a particular powered device 30, such as a Universal Serial Bus (USB) port 22, FireWire port (not shown), Serial ATA port (not shown), or RJ45 port (not shown). In the embodiment illustrated in FIG. 1, the plurality of peripheral bus receptacles 20 are illustrated as one or more USB ports 22 and one or more direct power over Ethernet adapter ports 24. Each direct power over Ethernet adapter port 24 comprises a POE data receptacle 25 paired with a corresponding POE power receptacle 26. Alternatively, when a powered device is a POE enabled powered device, direct power over Ethernet adapter ports 24 may simply comprise a POE data receptacle 25.

As shown in FIG. 2, the light fixture 10 further comprises a power over Ethernet power sourcing device 33 within the housing 13. In one preferred embodiment, the power over Ethernet power sourcing device 33 comprises a POE switch or endspan at least meeting the IEEE 802.2 at standard, that is, a network switch that has power over Ethernet injection built-in. Alternatively, in another preferred embodiment, the power over Ethernet power sourcing device 33 may comprise a midspan or POE injector. The power over Ethernet power sourcing device 33 is responsible for querying connected powered devices 30 to determine the need for power to be applied and to control the amount of power being pulled so that applicable limits are not exceeded.

The light fixture 10 may further comprise one or more internal peripheral bus receptacles 40 within the housing 13, such as USB ports 22 and/or one or more direct power over Ethernet adapter ports 24. The power over Ethernet power sourcing device 33 is operatively connected, such as by appropriate cabling or other connections (not shown) to the internal peripheral bus receptacles 40 and the external peripheral bus receptacles 20. Internal peripheral bus receptacles 40 located within the housing 13 and external peripheral bus receptacles 20 on the outer housing 13 of the light fixture 10 allow the creation of a local area network or Ethernet within the light fixture 10 by allowing for one or more powered devices 30, such as wireless telecommunications device 36 (operating under any suitable standard for wireless communication of high speed data, including 3G wireless, 4G wireless (or LTE) or any suitable standard), microcontroller unit 37, and a network switch 38 to be operatively interconnected, such as by appropriate connecting cables 21, such as the illustrated data cable 31 and power cable 32, to the power over Ethernet power sourcing device 33 through such peripheral bus receptacles 20, 40.

Alternatively, internal peripheral bus receptacles 40 may also comprise fixed connections between the power over Ethernet power sourcing device 33 and one or more of the more desirable powered devices 30, such as a wireless telecommunications device 36, camera (not shown), or a light control unit 39 for controlling the operation of the light units 12 of the light fixture 10.

In another embodiment, one or more of the powered devices 30 may comprise POE-enabled powered devices that may be directly attached by appropriate CAT-5 cable connections to the power over Ethernet power sourcing device 33 at a power over Ethernet adapter port 24 of the appropriate type.

The specific powered devices 30 suitable for attachment to the light fixture 10 may be any peripheral or controller device desired which may now or in the future exist which may be operated through a peripheral bus receptacle 20 or 40 or which require another form of connection for both a power source and a data communication link. Powered devices 30 may comprise any electronic or electrical device requiring a source of power or power and data communication. Powered devices 30 suitable for the present invention may include, but are not limited to, control units for the lights, control units for other powered devices, computer networking devices, network switches, network routers, security cameras, traffic cameras, video cameras, still-photography cameras, other surveillance equipment, rain sensors, air quality sensors, chemical sensors, radiation sensors, light sensors, temperature sensors, wind sensors, humidity sensors, air pressure sensors, wireless access points, wireless data uplink units, wireless data receivers, telecommunication transmitters and receivers, two way radios, VOIP telephones, energy consumption meters, heating devices, cooling devices, fans, heat sinks, memory devices, or any other powered device desired and adaptable for attachment to a light fixture 10, such as a street light.

When the light fixture 10 is intended for outdoor use, the powered devices 30 and their connecting cables 21 to the external peripheral bus receptacles 20 will have to be waterproof and otherwise sturdy and rugged enough to function when exposed to the elements and temperature extremes without undue need for repair. Additional weather protection may be achieved through the strategic placement of peripheral bus receptacles 20 on the lower surfaces 17 of the outer housing 13 or locating the peripheral bus receptacles 20 in covered or uncovered recesses (not shown) formed in the outer housing 13. Of course the best weather protection for powered devices 30 is to locate them within the housing 13, such as the wireless telecommunications device 36 shown in FIG. 2. The opening or compartment 34 in the housing 13 shown in FIG. 2 would be covered with a releasably secured detachable access panel (not shown). One of the principal advantages of the present invention, however, is the ease and convenience that a light fixture according to the present invention affords for connecting and disconnecting external powered devices 30 to the external peripheral bus receptacles 20.

Returning to FIG. 1, releasably secured detachable protrusions, shells or casings 27 may be provided within which to house powered devices 30 or portions thereof, such as antennas or sensors (not shown). Such casings 27 provide additional weatherproofing and protection for the powered devices 30 which they surround and may be prefabricated in different shapes to contain and conceal different types, shapes and sizes of powered devices 30.

The outer housing 13 may alternately further comprise one or more fastening means 28 for demountably affixing and securing powered devices 30, such as the illustrated keyhole mount 51, threaded shaft 52, or other common alternative fastening means such as bolts, holes for receiving bolts, clamps, latches, slots, grooves, couplings, hooks, pins, cotter pins, screws or other joints specifically fashioned for holding a specific powered device 30, such as the female connection port 53 into which the male end (not shown) of casing 27 is releasably affixed. Any suitable fastening means 28 may be provided to accommodate the desired powered device or devices 30, and the placement and orientation of the fastening means 28 about the outer housing 30 may be designed differently to fulfill different needs and intended uses. Of course, a powered device 30 may be independently affixed to the support structure 16 and only operatively connected to an external peripheral bus receptacle 20 by appropriate cabling (not shown).

As shown in FIG. 2, the light fixture 10 is also operatively connected to receive power from an external power source 11 in any of the well known manners, such as the illustrated electrical line 18 entering the light fixture 10 via an access opening 42 in the mount 15. A terminal block 44 having multiple electrical output terminals (not shown) inside the housing 10 is adapted to be connected to the electrical line 18. Light units 12, preferably LED light units, are powered by connection to the terminal block 44 at a first electrical output terminal. Similarly, power is supplied to the power over Ethernet power sourcing device 33 by an electrical connection to the terminal block 44, preferably to a second electrical output terminal of the terminal block 44 so that the light units 12 and power over Ethernet power sourcing device 33 are run on separate electrical circuits originating at the terminal block 44 of the light fixture 10.

In an alternate embodiment, power source 11 may comprise a built-in solar power unit or batteries (not shown). Batteries may also be installed as a secondary or back-up power supply configured to engage and power the light fixture only in the event of the failure of the primary external power source 11.

Figure 3:
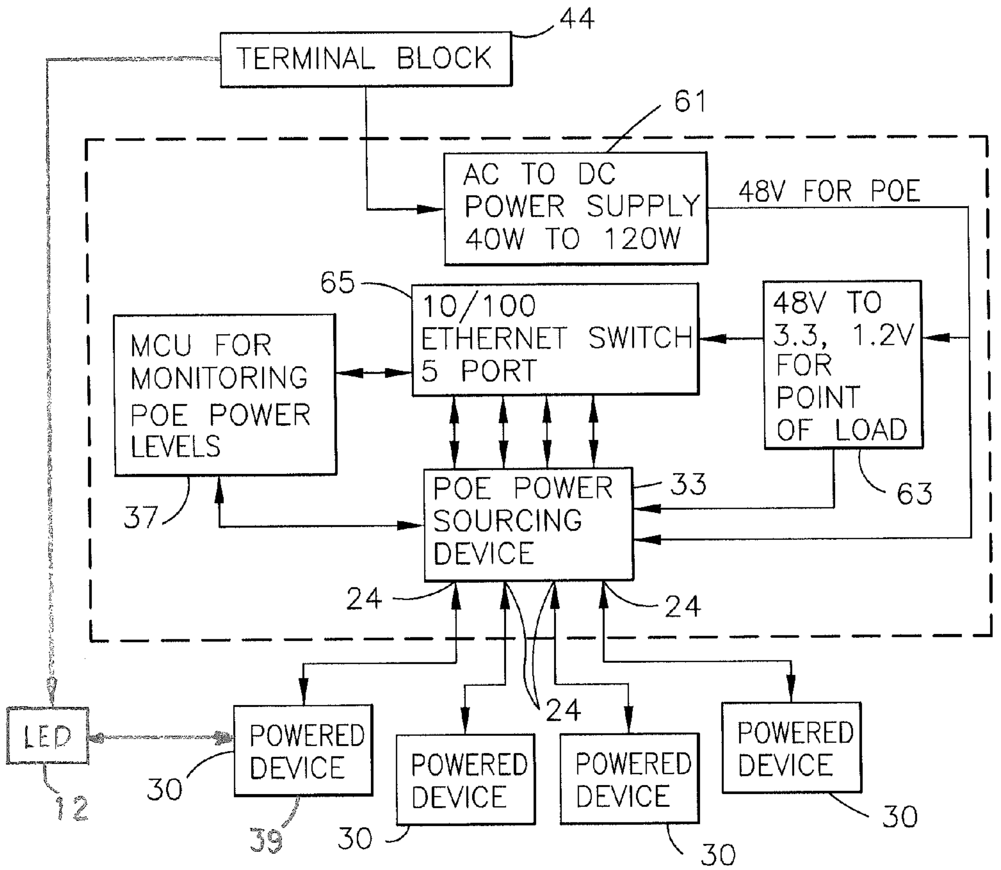
FIG. 3 is a block diagram of a power over Ethernet system of the light fixture of the present invention.

The block diagram of FIG. 3 illustrates a schematic of one embodiment of the present invention. In the embodiment illustrated in FIG. 3, the power over Ethernet power sourcing device 33 is a midspan injector operatively connected in any conventional method to an electrical terminal block 44 (and thus to the external power source 11), such as through AC to DC switching power supply 61, which provides an output of 48V that is used to power the power over Ethernet power sourcing device 33. The AC to DC switching power supply 61 may be sized as desired to power the intended powered devices (not shown in FIG. 3).

It is also preferable for the AC to DC switching power supply 61 to be operatively connected to a DC to DC converter 63 for local point of load within the system. The DC to DC converter 63 converts the 48V input and supplies a low voltage power output for powering low voltage powered devices such as the Ethernet switch 65 and microcontroller unit 37.

In other alternate embodiments, an AC/AC inverter power supply, or an AC receptacle may be installed in the light fixture to provide power to a powered device 30 of the type requiring an AC power input source.

An Ethernet switch 65, such as a five-port 10/100 Mb/s Ethernet switch, functions as a communication gateway between the different powered devices 30, providing a communications interface between the various powered devices 30 using standard Ethernet protocols. At least one port of the Ethernet switch 65 is connected to the microcontroller unit 37 which is used to monitor and control the power which is supplied to the different peripheral bus receptacles 20, 40. A serial interface between the microcontroller unit 37 and the power over Ethernet power sourcing device 33 allows the microcontroller unit 37 to access and control the voltage and current channeled to each port and the ability to separately turn on and off one or more of the peripheral bus receptacles 20, 40 or any other direct connections to the power over Ethernet power sourcing device 33.

A plurality of ports of the Ethernet switch 65 are connected to the power over Ethernet power sourcing device 33, which in turn provides a data connection and a power connection to a plurality of direct POE ports 24 or peripheral bus receptacles 20, 40. As described above, direct POE ports 24 provide data connection and power connection to additional powered devices 30 or to internal peripheral bus receptacles 40 and external peripheral bus receptacles 20.

As better illustrated in FIGS. 1 and 2, the power over Ethernet power sourcing device 33 provides one or more, preferably a plurality of peripheral bus receptacles 20,40, such as USB ports, each of which is adapted to provide power to and data communication among a number of powered devices. Specifically, at a minimum, a light fixture 10 according to the present invention comprises a power over Ethernet power sourcing device 33 operatively connected to provide a power connection and a data connection to a wireless, hard-wired or fiber optic telecommunications device 36, a microcontroller unit 37 for monitoring and controlling the voltage and current of each POE port 24 and/or peripheral bus receptacles 20, 40, and a light control unit 39 for controlling the light units 12 of the light fixture 10. The telecommunications device 36 transmits data and provides a connection between the local area network or Ethernet of the powered devices 30 of the light fixture 10 and a global computer information network, such as the Internet. Additionally, one or more peripheral powered devices 30, such as a digital camera, wireless access point, cooling unit, or other desired sensors may then be easily connected, disconnected and exchanged through use of the peripheral bus receptacles, and each of the powered devices may in turn be remotely controlled by and return data to a wirelessly connected central communication and control computer (not shown) through the communications link provided by the wireless telecommunications device 36.

In an alternate embodiment, the telecommunications device 36 may have only a data connection from the power over Ethernet power sourcing device 33 and have a power input connection (not shown) for receiving power that may be connected to either the power over Ethernet power sourcing device 33 or to an electrical output terminal (not shown) of the terminal block 44. In other words, the telecommunications device 36 may have an independent power connection separate from the power over Ethernet power sourcing device 33, but still be connected to the local area network of the light fixture 10. Such a configuration may be warranted in certain situations, such as where the telecommunications device 36 is of a type requiring greater power input than may be supplied through a power over Ethernet power sourcing device 33. Similarly, other types of powered devices 30 may be operatively connected to the local area network of the light fixture 10 but require independent electrical power connections. Such powered devices 30 would be operable through the local area network, but not supplied powered through the power over Ethernet power sourcing device 33.

In an alternate embodiment, a powered device 30 may further comprises a metrology chip device (not shown) operatively interconnected to another of the powered devices 30 connected to the power over Ethernet power sourcing device 33. A metrology chip device may be tasked to monitor and report power status data for a powered device 30 back to the central communications and control computer. Such a metrology chip device is especially useful for determining the operational status of each powered device 30 and would enhance the ability to make quick and efficient repairs by providing knowledge regarding the nature of issues prior to physically visiting the light fixture 10, thereby providing a cost savings over light fixtures 10 having un-monitored powered devices 30.

The input and output power of the power over Ethernet power sourcing device 33 and each of the powered devices 30 and be remotely monitored. It will be useful for the owner of the attached powered devices 30 to be notified of a power failure or malfunction of the device, so that proper restoration can be put into effect.

Although this invention has been disclosed and described in its preferred forms with a certain degree of particularity, it is understood that the present disclosure of the preferred forms is only by way of example and that numerous changes in the details of operation and in the combination and arrangement of parts may be resorted to without departing from the spirit and scope of the invention as hereinafter claimed.

I claim:

1. A device comprising:

(a) a housing, said housing having at least one light receptacle for receiving and providing power to one or more light units;

(b) a connection for receiving power from an external power source;

(c) said housing having one or more external peripheral bus receptacles to which one or more external powered devices may be operatively connected;

(d) one or more internal peripheral bus receptacles within said housing, said internal peripheral bus receptacles providing a releasable operative connection for the attachment of one or more internal powered devices;

(e) a power over Ethernet power sourcing device within said housing, said power over Ethernet power sourcing device operatively connected to said connection for receiving power from the external power source and selectively configured to output power and data over an Ethernet connection to:

(i) one or more of said internal peripheral bus receptacles, and (ii) one or more of said external peripheral bus receptacles;

(f) a wireless telecommunications device within said housing, said wireless telecommunications device having a data connection to said power over Ethernet power sourcing device and a power input connection for receiving power; and (g) a microcontroller unit within said housing, said microcontroller unit having a data connection and a power connection to said power over Ethernet power sourcing device, said microcontroller unit for controlling the power and data channeled to said Ethernet connections of said power over Ethernet power sourcing device.

2. The device of claim 1 further comprising a light control unit within said housing, said light control unit having a data connection and a power connection to said power over Ethernet power sourcing device, said light control unit being operatively connected to said one or more light units when said light units are installed in said light receptacle.

3. The device of claim 1 wherein said connection for receiving power from an external power source further comprises a terminal block having a plurality of electrical output terminals, said light receptacle being connected to receive power from a first of said electrical output terminals, and said power over Ethernet power sourcing device being connected to receive power from a second of said electrical output terminals.

4. The device of claim 3 wherein said wireless telecommunications device is connected to receive power from one of said electrical output terminals.

5. The device of claim 1 wherein said wireless telecommunications device is connected to receive power from said power over Ethernet power sourcing device.

6. The device of claim 1 wherein at least one of said external powered devices is operatively connected to said power over Ethernet power sourcing device through one of said external peripheral bus receptacles.

7. The device of claim 6 further comprising a metrology chip device within said housing, said metrology chip device having a data connection and a power connection to said power over Ethernet power sourcing device and operatively interconnected with one of said external powered devices to monitor and report power status data for said external powered device.

8. The device of claim 1 wherein at least one of said internal powered devices is operatively connected to said power over Ethernet power sourcing device through one of said internal peripheral bus receptacles.

9. The device of claim 8 further comprising a metrology chip device within said housing, said metrology chip device having a data connection and a power connection to said power over Ethernet power sourcing device and operatively interconnected with one of said internal powered devices to monitor and report power status data for said internal powered device.

10. The device of claim 1 further comprising an internal powered device within said housing, said internal powered device within said housing having a data connection and a power connection to said power over Ethernet power sourcing device.

11. The device of claim 10 further comprising a metrology chip device within said housing, said metrology chip device having a data connection and a power connection to said power over Ethernet power sourcing device and operatively interconnected with one of said internal powered devices to monitor and report power status data for said internal powered device.

12. The device of claim 1 wherein the housing further comprises one or more interfaces for providing data and power to an external powered device.

13. The device of claim 1 further comprising one or more interfaces within said housing for providing data and power to said powered devices.

14. A device comprising:

(a) a housing, said housing having at least one light receptacle for receiving and providing power to one or more light units;

(b) a connection for receiving power from an external power source;

(c) one or more internal peripheral bus receptacles configured to releasably connect to one or more internal powered devices within said housing;

(d) one or more external peripheral bus receptacles accessible from outside said housing configured to releasably connect to one or more external powered devices about the housing;

(e) a power over Ethernet power sourcing device within said housing, said power over Ethernet power sourcing device operatively connected to said connection for receiving power from the external power source and selectively configured to output power and data over an Ethernet connection to the one or more internal peripheral bus receptacles and the one or more external peripheral bus receptacles;

(f) a wireless telecommunications device within said housing, said wireless telecommunications device having a data connection to said power over Ethernet power sourcing device and a power input connection for receiving power; and (g) a microcontroller unit within said housing, said microcontroller unit having a data connection and a power connection to said power over Ethernet power sourcing device, said microcontroller unit for controlling the power and data channeled to the one or more internal peripheral bus receptacles and the one or more external peripheral bus receptacles.

15. The device of claim 14 wherein said connection for receiving power from an external power source further comprises a terminal block having a plurality of electrical output terminals, said light receptacle being connected to receive power from a first of said electrical output terminals, and said power over Ethernet power sourcing device being connected to receive power from a second of said electrical output terminals.

16. The device of claim 15 wherein said power input connection for receiving power of said wireless telecommunications device is connected to receive power from one of said electrical output terminals.

17. The device of claim 14 wherein said power input connection for receiving power of said wireless telecommunications device is connected to receive power from said power over Ethernet power sourcing device.

18. The device of claim 14 wherein at least one external powered device outside of said housing is operatively connected to said power over Ethernet power sourcing device through one of said external peripheral bus receptacles.

19. The device of claim 18 further comprising a metrology chip device within said housing, said metrology chip device having a data connection and a power connection to said power over Ethernet power sourcing device and operatively interconnected with one of said external powered devices to monitor and report power status data for said external powered device.

20. The device of claim 14 wherein at least one internal powered device inside of said housing is operatively connected to said power over Ethernet power sourcing device through one of said internal peripheral bus receptacles.

21. The device of claim 20 further comprising a metrology chip device within said housing, said metrology chip device having a data connection and a power connection to said power over Ethernet power sourcing device and operatively interconnected with said internal powered device to monitor and report power status data for said internal powered device.

22. The device of claim 14 further comprising a light control unit within said housing, said light control unit having a data connection and a power connection to said power over Ethernet power sourcing device, said light control unit being operatively connected to a light unit when a light unit is installed in one of said light receptacles.

23. A device comprising:

(a) a housing, said housing having at least one light receptacle for receiving and providing power to one or more light units;

(b) a connection for receiving power from an external power source;

(c) a power over Ethernet power sourcing device within said housing, said power over Ethernet power sourcing device operatively connected to receive power from said connection for receiving power from an external power source, said power over Ethernet power sourcing device comprising:

(i) one or more internal peripheral bus receptacles within said housing for selectively providing data and power through an Ethernet connection; and (ii) one or more external peripheral bus receptacles accessible from outside said housing for selectively providing data and power through said Ethernet connection;

(d) a wireless telecommunications device within said housing, said wireless telecommunications device having a data connection to said power over Ethernet power sourcing device and a power input connection for receiving power;

(e) a microcontroller unit within said housing, said microcontroller unit having a data connection and a power connection to said power over Ethernet power sourcing device, said microcontroller unit for controlling the power channeled to said internal peripheral bus receptacles of said power over Ethernet power sourcing device and said external peripheral bus receptacles of said power over Ethernet power sourcing device; and (f) a light control unit within said housing, said light control unit having a data connection to said power over Ethernet power sourcing device and a power input connection for receiving power, said light control unit being operatively connected to a light unit when a light unit is installed in one of said light receptacles.

24. The device of claim 23 wherein said connection for receiving power from an external power source further comprises a terminal block having a first electrical output terminal and a second electrical output terminal, said light receptacle electrically connected to said first electrical output terminal, and said power over Ethernet power sourcing device electrically connected to said second electrical output terminal.

25. The device of claim 24 wherein said wireless telecommunications device is connected to receive power from one of said electrical output terminals.

26. The device of claim 23 further comprising:

(a) a powered device outside of said housing, said powered device being operatively connected to said power over Ethernet power sourcing device through one of said external peripheral bus receptacles of said power over Ethernet power sourcing device; and (b) a metrology chip device within said housing, said metrology chip device having a data connection and a power connection to said power over Ethernet power sourcing device and operatively interconnected with said powered device to monitor and report power status data for said powered device.

27. The device of claim 23 having at least one powered device inside of said housing operatively connected to said power over Ethernet power sourcing device through one of said internal peripheral bus receptacles of said power over Ethernet power sourcing device.

28. The device of claim 27 further comprising a metrology chip device within said housing, said metrology chip device having a data connection and a power connection to said power over Ethernet power sourcing device and operatively interconnected with said powered device to monitor and report power status data for said powered device.

29. The device of claim 23 further comprising a powered device outside of said housing, said powered device being operatively connected to said power over Ethernet power sourcing device through one of said external peripheral bus receptacles of said power over Ethernet power sourcing device.

30. The device of claim 23 wherein said wireless telecommunications device is connected to receive power from said power over Ethernet power sourcing device.

* * * * *